United States Patent
Suzuki et al.

(10) Patent No.: US 12,232,431 B2
(45) Date of Patent: Feb. 18, 2025

(54) MEMORY DEVICE

(71) Applicant: KIOXIA CORPORATION, Tokyo (JP)

(72) Inventors: Kunifumi Suzuki, Yokkaichi Mie (JP); Yuuichi Kamimuta, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 442 days.

(21) Appl. No.: 17/587,267

(22) Filed: Jan. 28, 2022

(65) Prior Publication Data

US 2022/0399488 A1 Dec. 15, 2022

(30) Foreign Application Priority Data

Jun. 11, 2021 (JP) .................. 2021-097862

(51) Int. Cl.
*H10N 70/20* (2023.01)
*H10B 63/00* (2023.01)
*H10N 70/00* (2023.01)

(52) U.S. Cl.
CPC ........... *H10N 70/231* (2023.02); *H10B 63/24* (2023.02); *H10B 63/84* (2023.02); *H10N 70/063* (2023.02); *H10N 70/8828* (2023.02)

(58) Field of Classification Search
None
See application file for complete search history.

(56) References Cited

U.S. PATENT DOCUMENTS

| | | |
|---|---|---|
| 8,487,345 B2 | 7/2013 | Tsukamoto et al. |
| 2006/0261379 A1 | 11/2006 | Tsukamoto et al. |
| 2015/0123066 A1* | 5/2015 | Gealy ................. H10N 70/231 257/4 |
| 2018/0205017 A1* | 7/2018 | Bruce ..................... H10B 63/84 |
| 2020/0111839 A1* | 4/2020 | Song ..................... H10B 63/24 |
| 2020/0388649 A1* | 12/2020 | Takahashi ........... H10B 63/845 |
| 2022/0231224 A1* | 7/2022 | Song .................. H10N 70/8616 |

FOREIGN PATENT DOCUMENTS

| | | |
|---|---|---|
| JP | 2006-324501 A | 11/2006 |
| JP | 2007-157776 A | 6/2007 |
| WO | 2009/122570 A1 | 10/2009 |

* cited by examiner

*Primary Examiner* — Mounir S Amer
(74) *Attorney, Agent, or Firm* — Kim & Stewart LLP

(57) ABSTRACT

A memory device includes a first interconnect layer, a second interconnect layer, a phase-change layer, and an adjacent layer. The phase-change layer is disposed between the first interconnect layer and the second interconnect layer and configured to reversibly transition between a crystalline state and an amorphous state. The adjacent layer contacts the phase-change layer and comprises tellurium and at least one of titanium, zirconium, or hafnium.

12 Claims, 10 Drawing Sheets

MEMORY DEVICE

CROSS-REFERENCE TO RELATED APPLICATION(S)

This application is based upon and claims the benefit of priority from Japanese Patent Application No. 2021-097862, filed Jun. 11, 2021, the entire contents of which are incorporated herein by reference.

FIELD

Embodiments described herein relate generally to a memory device.

BACKGROUND

Development of a new type of memory device, called a "phase-change memory", is in progress for use in information devices, such as cellular phones. In one possible type of phase-change memory device, a voltage pulse is applied to a phase-change material so that the material reversibly transitions between a high-resistance amorphous state and a low-resistance crystalline state, which provide different electrical resistances. In such a phase-change memory device, the electrical resistance state of the phase-change material is stably maintained even after the memory device is turned off (powered down). As a result, data corresponding to the electrical resistance state of the phase-change material can be stored in a non-volatile manner.

DETAILED DESCRIPTION

Embodiments provide a memory device having an increased operation speed.

In general, according to an embodiment, a memory device includes a first interconnect layer, a second interconnect layer, a phase-change layer, and an adjacent layer. The phase-change layer is disposed between the first interconnect layer and the second interconnect layer and configured to reversibly transition between a crystalline state and an amorphous state. The adjacent layer contacts the phase-change layer and comprises tellurium and at least one of titanium, zirconium, or hafnium.

Certain example embodiments of the present disclosure will now be described with reference to the drawings. For easier understanding of the drawings and the description below, the same reference symbols are used for the same or substantially similar aspects, components, or elements, and the description of such aspects, components, or elements will not necessarily be repeated after an initial description.

Figure 1:
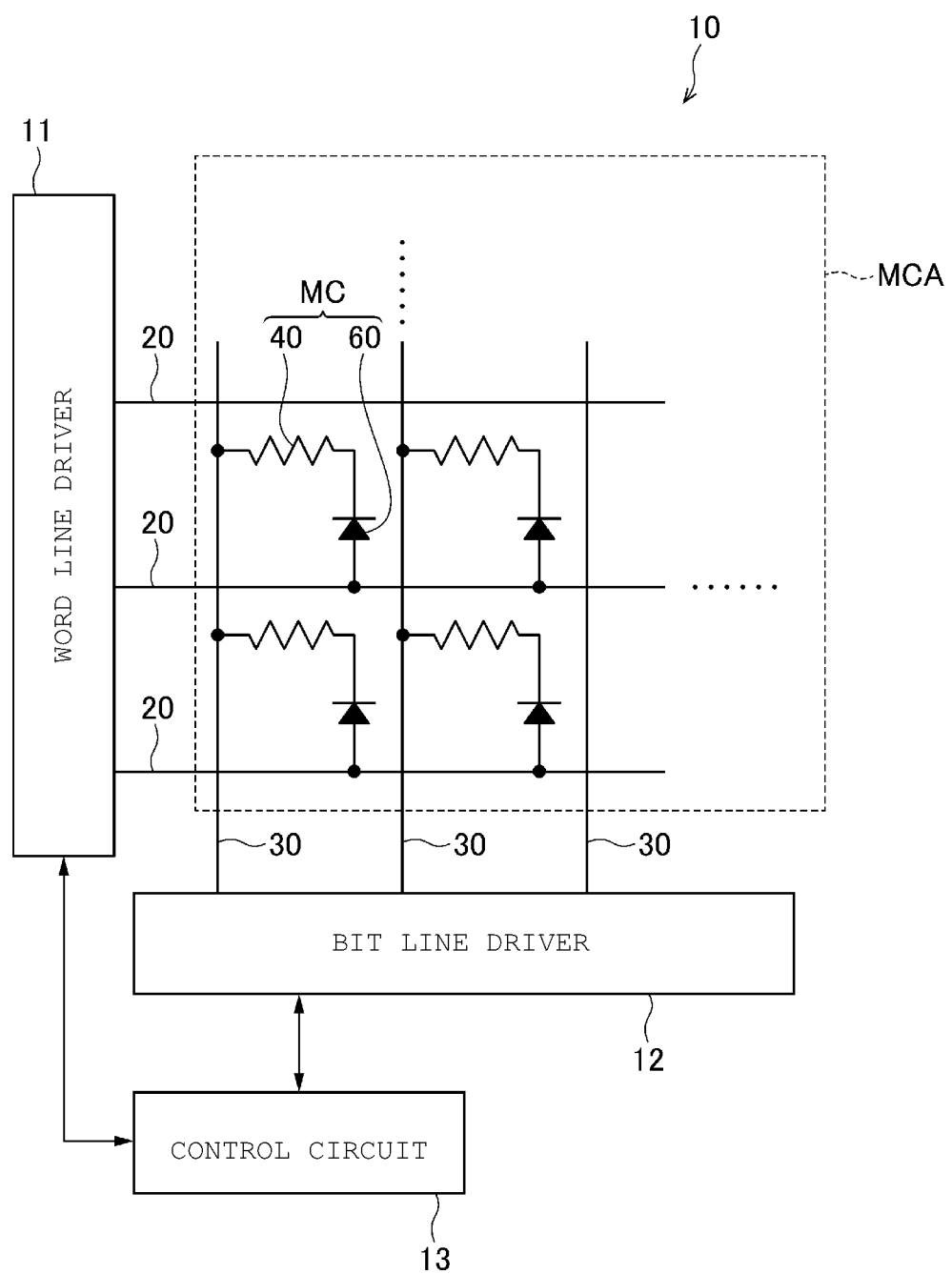
FIG. 1 depicts a configuration of a memory device according to a first embodiment.

A first embodiment will be described as one example of a memory device. A memory device 10 according to the first embodiment is a so-called "PCM (Phase-Change Memory)". As shown in FIG. 1, the memory device 1 includes a memory cell array MCA, a word line driver 11, a bit line driver 12, and a control circuit 13.

Figure 2:
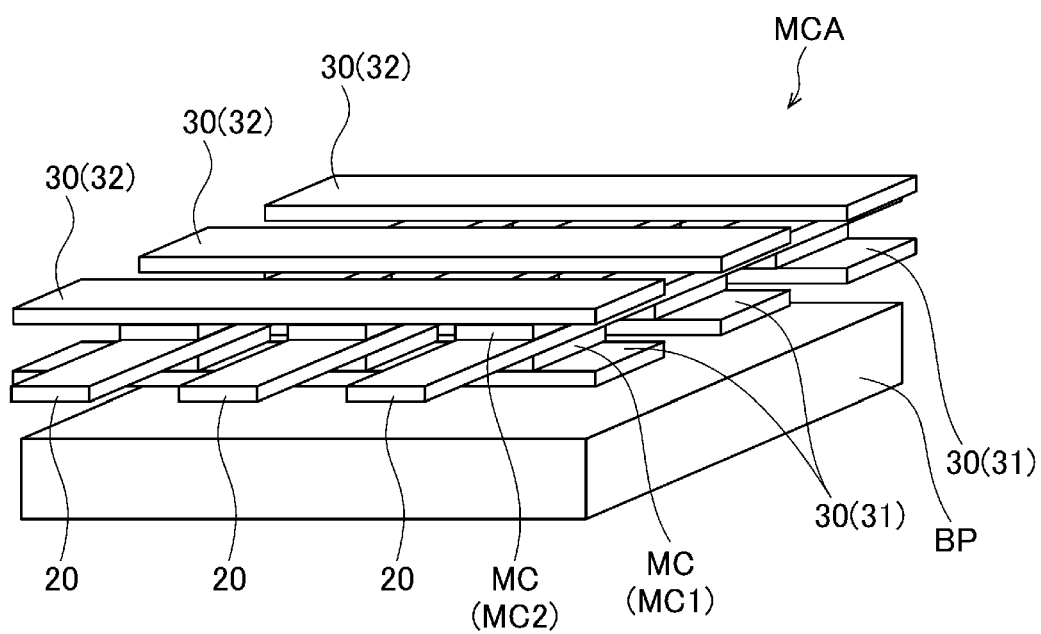
FIG. 2 depicts an example configuration of a memory cell array in a memory device of a first embodiment.

The memory cell array MCA is a section which includes a plurality of memory cells MC that store data. The memory device 10 has a plurality of word lines 20 and a plurality of bit lines 30. These lines are formed as interconnect layers for applying a voltage to the memory cells MC. Each memory cell MC is connected at one end to one of the word lines 20, and connected at the opposite end to one of the bit lines 30. As shown in FIG. 2, each memory cell MC is provided at one of the intersections of the word lines 20 and the bit lines 30. Only some of the memory cells MC of the memory cell array MCA are depicted in FIG. 1.

Each memory cell MC has a phase-change layer 40 and a selector 60. As shown by the equivalent circuit in FIG. 1, the phase-change layer 40 and the selector 60 are electrically connected in series between a word line 20 and a bit line 30. In FIG. 1, each phase-change layer 40 is depicted as being disposed on the side of a bit line 30, and each selector 60 is depicted as being disposed on the side of a word line 20. Alternatively, each phase-change layer and each selector 60 may be disposed in different positions. For example, in some or all of the memory cells MC, each phase-change layer 40 and each selector 60 may be disposed in the opposite positions to those of FIG. 1.

The phase-change layer 40 is formed of a phase-change material, and stores data corresponding to the value of the electrical resistance. In the present embodiment, a chalcogenide material composed of germanium-antimony-tellurium (GeSbTe) is used as the phase-change material. Alternatively, other phase-change materials may be used for the phase-change layer 40, and it is preferred to use a material comprising at least one of germanium, antimony and tellurium as a main component.

When a predetermined voltage pulse is applied to the phase-change layer 40, it melts by Joule heat into a molten state. The molten phase-change layer 40 goes into an amorphous state when cooled rapidly, while molten phase-change layer 40 goes into a crystalline state when cooled slowly over time. The cooling rate of the molten phase-change layer 40 may be adjusted, for example, by adjusting the fall time of the voltage pulse.

The electrical resistance of the phase-change layer 40 in an amorphous state is higher than the electrical resistance of the phase-change layer 40 in a crystalline state. The phase-change layer 40 can thus reversibly transition between a crystalline state and an amorphous state, and have different electrical resistance values in the different states. In each memory cell MC, information (0 or 1) corresponding to the electrical resistance of the phase-change layer 40 is stored.

The selector 60 is a two-terminal switching element having a non-linear current-voltage characteristic. When a difference of voltages applied to both ends of the selector 60 is not more than a predetermined threshold value, almost no electric current flows in the selector 60. When the difference of the voltages applied to both ends of the selector 60 exceeds the threshold value, an electric current rapidly flows in the selector 60. The provision of the selector 60 in each memory cell MC makes it possible to allow an electric current to flow only in those phase-change layers 40 for which writing or erasing of data is to be performed, thereby changing the electrical resistances of the phase-change layers 40.

The word line driver 11 is a circuit for adjusting the electric potential of each word line 20. One end of each word line 20 is connected to the word line driver 11. The word line driver 11 includes a group of switches for selectively connecting each word line 20 to a voltage generation circuit. The operation of the word line driver 11 is controlled by the below-described control circuit 13.

The bit line driver 12 is a circuit for adjusting the electric potential of each bit line 30. One end of each bit line 30 is connected to the bit line driver 12. The bit line driver 12 includes a group of switches for selectively connecting each bit line 30 to a voltage generation circuit. The bit line driver 12 may include a circuit for acquiring data, stored in each memory cell MC, based on an electric current flowing in the bit line 30. The bit line driver 12 may also include a circuit for adjusting the electric potential of each bit line 30 according to write data. The operation of the bit line driver 12 is controlled by the control circuit 13.

The control circuit 13 controls the overall operation of the memory device 10. The control circuit 13 performs, for example, application of a voltage pulse to each memory cell MC by controlling the operation of the word line driver 11 and the operation of the bit line driver 12 as described above. When writing data to the memory cell array MCA, the control circuit 13 applies a voltage pulse, corresponding to write data, to each of target memory cells MC, thereby changing the electrical resistance of the phase-change layer 40 of each target memory cell MC to a value corresponding to the write data. When reading data from the memory cell array MCA, the control circuit 13 applies a voltage pulse to each of target memory cells MC and, based on an electric current flowing in each memory cell MC, reads data corresponding to the electrical resistance of each phase-change layer 40.

FIG. 2 schematically depicts an example configuration of the memory cell array MCA. FIG. 2 only shows word lines 20, bit lines 30, memory cells MC, and a semiconductor substrate BP; the depiction of insulating layers 81, 82 (see FIG. 4) formed around the memory cells MC and so on is omitted.

In FIG. 2, for purposes of description, an x axis is set along the direction in which the word lines 20 extend. A y axis is along the direction in which the bit lines 30 extend. A z axis is set along the vertical direction. The x axis, the y axis, and the z axis are perpendicular to each other. A direction parallel to the x axis is hereinafter also referred to as "x direction". Similarly, a direction parallel to the y axis is hereinafter also referred to as "y direction", and a direction parallel to the z axis is hereinafter also referred to as "z direction". The same directional notation system is used for description in other figures.

As shown in FIG. 2, the memory cell array MCA is formed on the upper side of the semiconductor substrate BP. The semiconductor substrate BP is, for example, a silicon substrate.

Each word line 20 extends in the x direction, and a plurality of word lines 20 are arranged side-by-side in the y direction. The word line 20 corresponds to a "first interconnect layer" in the present embodiment. Each bit line 30 extends in the y direction, and a plurality of bit lines 30 are arranged side-by-side in the x direction. The bit line 30 corresponds to a "second interconnect layer" in the present embodiment.

In the present embodiment, a plurality of bit lines 30 are disposed both below and above the word lines 20. Therefore, the memory cells MC, which are provided at the intersections of the word lines 20 and the bit lines 30 in a top view, are provided both between the word lines 20 and the bit lines 30 located below, and between the word lines 20 and the bit lines 30 located above. The bit lines 30 disposed below the word lines 20 will be hereinafter also referred to as the "bit lines 31". The bit lines 30 disposed above the word lines 20 will be hereinafter also referred to as the "bit lines 32".

Figure 3:
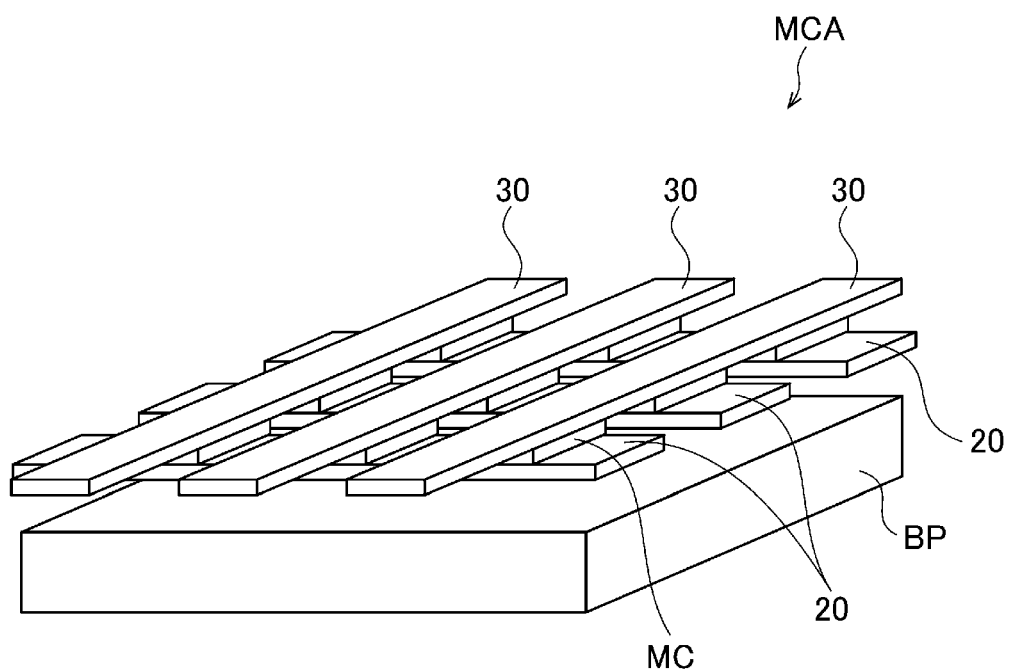
FIG. 3 depicts another example configuration of a memory cell array in a memory device of a first embodiment.

Instead of the configuration illustrated in FIG. 2, it is possible to use a configuration in which a plurality of bit lines 30 are disposed only above the word lines 20 as shown in FIG. 3. In this case, the memory cells MC are provided only between the word lines 20 and the bit lines 30 located above.

Figure 4:
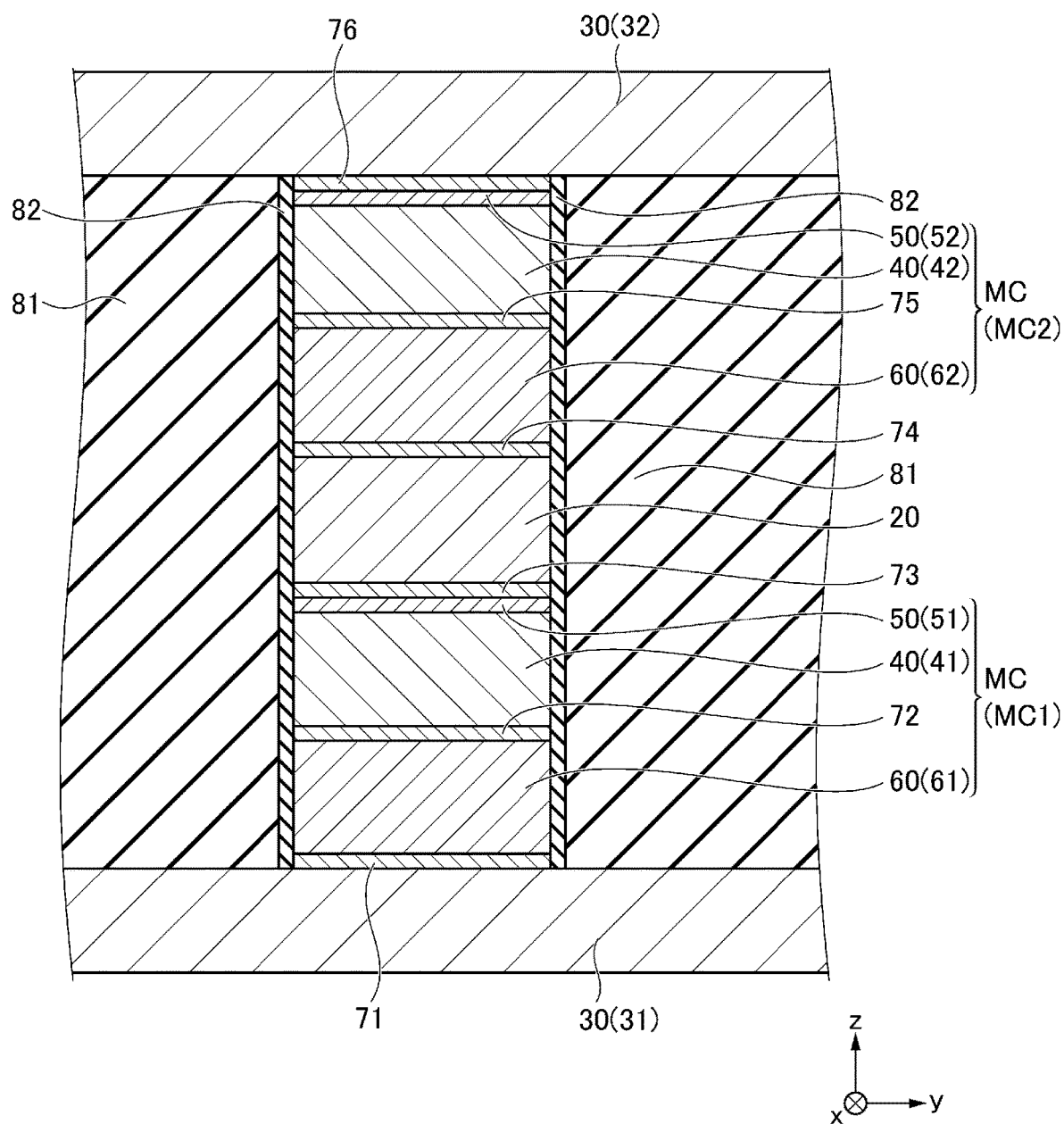
FIG. 4 illustrates a cross-sectional view of certain memory cells and surroundings in a memory device according to a first embodiment.

The configuration of the memory cell MC will now be described in more detail with reference to FIG. 4. FIG. 4 shows certain memory cells MC and vicinity in a cross-section perpendicular to the x axis. The memory cells MC depicted in FIG. 4 are a pair of memory cells MC disposed above and below a word line 20. In the example of FIG. 4, the selector 60 and the phase-change layer 40 are arranged in this order in the z direction in each memory cell MC. Alternatively, the selector 60 and the phase-change layer 40 may be arranged in the opposite order in each memory cell MC. In some examples, the order of arrangement of the selector 60 and the phase-change layer 40 in the upper memory cell MC may be opposite to the order of arrangement of the selector 60 and the phase-change layer 40 in the lower memory cell MC.

The memory cell MC disposed below the word line 20 will be hereinafter also referred to as the "memory cell MC1". The memory cell MC disposed above the word line 20 will be hereinafter also referred to as the "memory cell MC2". The phase-change layer 40 and the selector 60 of the lower memory cell MC1 will be hereinafter also referred to as the "phase-change layer 41" and the "selector 61", respectively. Similarly, the phase-change layer 40 and the selector 60 of the upper memory cell MC2 will be hereinafter also referred to as the "phase-change layer 42" and the "selector 62", respectively.

Each memory cell MC also has an adjacent layer 50 in contact with the phase-change layer 40. The reason for having the adjacent layer 50 in each memory cell MC will be described below. An adjacent layer 50 of the lower memory cell MC1 will be hereinafter also referred to as "adjacent layer 51". Similarly, an adjacent layer 50 of the upper memory cell MC2 will be hereinafter also referred to as "adjacent layer 52".

The configuration of the memory cell MC1 will now be described. As shown in FIG. 4, the memory cell MC1 includes the selector 61, a conductive layer 72, the phase-change layer 41 and the adjacent layer 51, which are stacked in this order from the bottom. In the example of FIG. 4, the phase-change layer 41 and the adjacent layer 51 are arranged in this order in the z direction in each memory cell MC1. Alternatively, the phase-change layer 41 and the adjacent layer 51 may be arranged in the opposite order in each memory cell MC1. In some examples, the order of arrangement of the phase-change layer 42 and the adjacent layer 52 in the upper memory cell MC2 may be opposite to the order of arrangement of the phase-change layer 41 and the adjacent layer 51 in the lower memory cell MC1.

The selector 61 is connected to the bit line 31 located below via a conductive layer 71. A metal material such as tungsten, for example, may be used for the conductive layer 71. The selector 61 is formed of, for example, a material containing a chalcogen element.

The conductive layer 72 can be made of the same metal material as that of the conductive layer 71, and is formed between the selector 61 and the phase-change layer 41.

As described above, the phase-change layer 41 is formed of germanium-antimony-tellurium (GeSbTe), which is a phase-change material. When the memory device 10 is in operation, a pulsed voltage can be applied between the word line 20 and the bit line 31, whereby the phase-change layer 41 transitions back and forth between a crystalline state and an amorphous state.

The adjacent layer 51 directly covers the entire upper surface of the phase-change layer 41. Thus, the adjacent layer 51 is in contact with the upper surface of the phase-change layer 41. In the present embodiment, titanium ditelluride ($TiTe_2$) is used as a material for the adjacent layer 51. The material of the adjacent layer 51 is not limited to this compound; for example, a material such as hafnium ditelluride ($HfTe_2$) or zirconium ditelluride ($ZrTe_2$) may be used. Thus, a tellurium compound comprising at least one of titanium, zirconium, and/or hafnium may be used. It is preferred to select such a tellurium-containing material for the adjacent layer 51 so as to make the atomic concentration of tellurium in the adjacent layer 51 be not less than 60% but not more than 70%.

The adjacent layer 51 is connected to the word line 20 located above via a conductive layer 73. The conductive layer 73 can be made of the same metal material as the conductive layers 71, 72.

The memory cell MC2 has the same configuration as the above-described configuration of the memory cell MC1. Thus, the respective materials of the selector 62, the phase-change layer 42, and the adjacent layer 52 of the memory cell MC2 are the same as the respective materials of the selector 61, the phase-change layer 41, and the adjacent layer 51 of the memory cell MC1. However, the order of arrangement of the selector 62, the phase-change layer 42, and the adjacent layer 52 in the memory cell MC2 may differ from the order of arrangement of the selector 61, the phase-change layer 41, and the adjacent layer 51 in the memory cell MC1.

A conductive layer 74, which can be made of the same metal material as the conductive layer 71, is provided between the word line 20 and the selector 62. A conductive layer 75, which can be made of the same metal material as the conductive layer 72, is provided between the selector 62 and the phase-change layer 42. A conductive layer 76, which can be made of the same metal material as the conductive layer 73, is provided between the adjacent layer 52 and the bit line 32.

As shown in FIG. 4, an insulating layer 81 is formed around the memory cells MC. The insulating layer 81 is formed of an insulating material such as silicon oxide ($SiO_2$). Memory cells MC, located at different positions in the x direction or in the y direction, are separated and electrically insulated from each other by the insulating layer 81. Since the insulating layer 81 is formed of a material having a relatively low thermal conductivity, memory cells MC located at different positions are also thermally insulated from each other. The insulating layer 81 prevents Joule heat, generated by a write operation to some memory cells MC, from transferring to other memory cells MC and causing an erroneous write (or erasing) operation.

The side surfaces of the memory cells MC and the word line 20 are covered with an insulating layer 82. Thus, the memory cells MC are not in contact with the insulating layer 81, but are covered with the insulating layer 81 via the insulating layer 82. The insulating layer 82 is formed of an insulating material containing no oxygen, such as silicon nitride (SiN). The insulating layer 82 prevents oxidation of materials, such as germanium, contained in the phase-change layer 40.

After a pulsed voltage is applied to a memory cell MC, the molten phase-change layer 40 cools and transitions into a crystalline state. The crystallization process may be considered to be divided into two stages: a first stage before formation of a first crystal nucleus (a nucleation site), and a second stage during which crystal grows from the first crystal nucleus as a starting point. The time from when the phase-change layer 40 is entirely molten until when crystal nucleation site is formed (that is, until the first stage is completed) is generally a few tens of microseconds. The time from when the crystal nucleus is formed until when the phase-change layer 40 is entirely in a crystalline state (that is, until the second stage is completed) is approximately a few tens of nanoseconds. Thus, the first stage until the formation of a first crystal nucleus is the rate-determining step of the process of transition of the phase-change layer 40 into a crystalline state.

In a phase-change memory having a so-called "dome-type" configuration, a phase-change layer melts but not entirely (that is, only partly) upon writing of data, and a portion around a molten portion remains in a crystalline state. Since such a crystalline portion continually exists as a possible crystal nucleation site, the phase-change layer can be entirely turned to a crystalline state in a short time without requiring the time for above-described first stage.

In contrast, in a configuration as in the present embodiment, a voltage pulse is applied to the phase-change layer 40 from the entire lower surface. Therefore, the phase-change layer 40 melts entirely without leaving a crystal nucleus (non-melted phase-change layer 40 already in the crystalline state). For that reason, since the phase-change layer 40 melts entirely, it is necessary for the phase-change layer 40 to undergo the first stage in which a crystal nucleus is formed. This requires a longer time to write data. The memory device 10 according to the present embodiment solves such a problem by providing the adjacent layer 50 in each memory cell MC.

As described above, the adjacent layer 50 is formed of $TiTe_2$. This $TiTe_2$ material has a two-dimensional crystal structure and a higher melting point than that of GeSbTe, which is one example material for the phase-change layer 40. Experiment has confirmed that even when the entirety of the phase-change layer 40 melts upon the application of a voltage pulse, the adjacent layer 50 can maintain its initial crystalline state without melting or mixing with adjacent materials.

In the present embodiment, an adjacent layer 50 is in contact with a part of the phase-change layer 40. When molten phase-change layer 40 cools, the $TiTe_2$ material constituting the adjacent layer 50 functions as a crystal nucleation site, and crystallization of the phase-change layer 40 can progress from the provided crystal nucleation site as a starting point. Thus, in the present embodiment, the provision of the adjacent layer 50 in contact with the phase-change layer 40 in effect allows the first stage (formation of a crystal nucleus) in the crystallization process of molten phase-change layer 40 to be skipped. This can reduce the time required for the entire phase-change layer 40 to go into a crystalline state, thus making it possible to increase the operation speed of the memory device 10 when writing data to the memory cell array MCA. The same effect can be achieved also by the use of $HfTe_2$ or $ZrTe_2$ as a material for the adjacent layer 50.

A method for manufacturing the memory device 10 according to the present embodiment will be described below.

<Stacking Step>

First, in a stacking step, after forming an insulating film on the upper side of a semiconductor substrate BP, a plurality of bit lines 31 are formed on the insulating film. The bit lines 31 may be formed, for example, by forming a metal film by CVD, and then etching the metal film by photolithography. Thereafter, an insulating film is formed by, for example, CVD such that the insulating film covers the bit lines 31 and their surroundings, followed by planarization of the insulating film by CMP, whereby the upper surfaces of the bit lines 31 are exposed.

Figure 5:
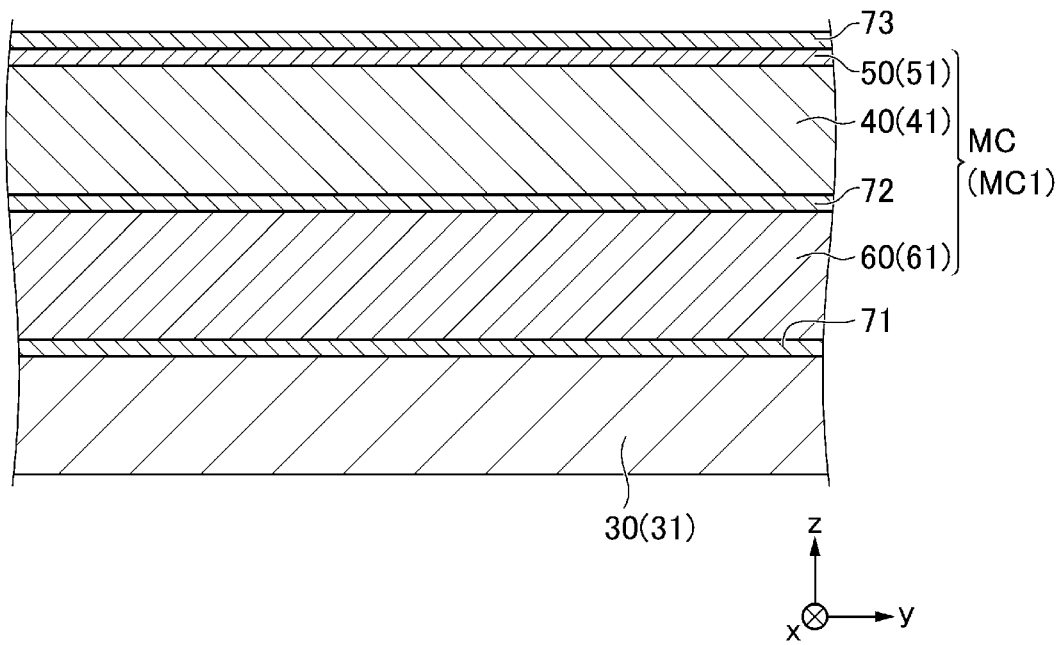
FIGS. 5-7 depict aspects related to a method for manufacturing a memory device according to a first embodiment.

Thereafter, a conductive layer 71, a selector 61, a conductive layer 72, a phase-change layer 41, an adjacent layer 51, and a conductive layer 73 are formed in this order from the bottom by, for example, CVD such that they cover the upper surface of each bit line 31. FIG. 5 shows a cross-sectional view of a portion of the resulting stacked structure upon completion of the stacking step.

<Patterning Step>

Figure 6:
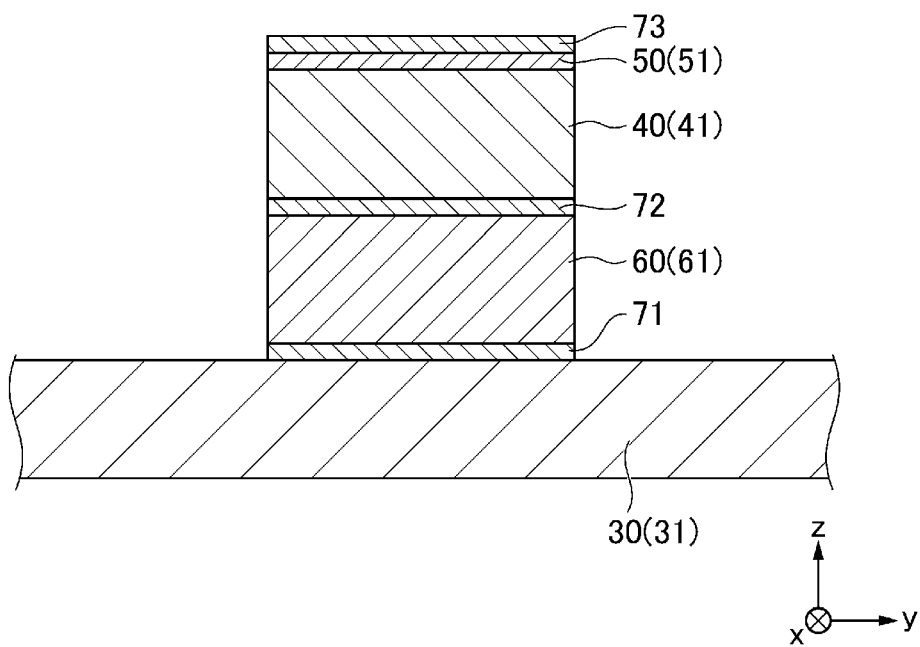

In a patterning step following the stacking step, the stacked films formed above each bit line 31 are partly removed by etching using, for example, photolithography. In particular, only a portion of the stacked films corresponding to a memory cell MC1 is left, while the other portion is removed. FIG. 6 shows a cross-sectional view of a portion of the resulting structure upon completion of the patterning step.

<Insulating Layer Formation Step>

Figure 7:
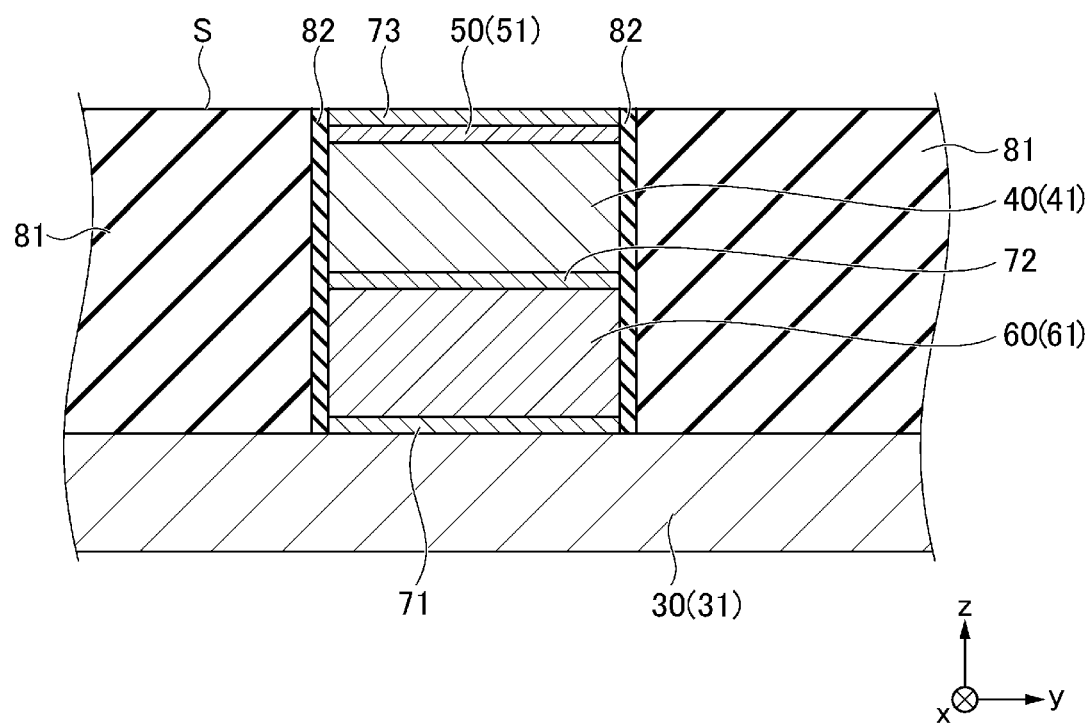

In an insulating layer formation step following the patterning step, an insulating layer 82 and an insulating layer 81 are formed in this order by CVD such that they fill spaces surrounding the memory cells MC1 formed in the patterning step. Thereafter, the entire upper surfaces of the insulating layer 81, the insulating layer 82, and so on are subjected to CMP (Chemical Mechanical Polishing), whereby the conductive layer 73 is exposed along the flat surface S. FIG. 7 shows a cross-sectional view of a portion of the resulting structure upon completion of the insulating layer formation step.

After forming the memory cells MC1 and surrounding portions in the above-described manner, word lines 20 are formed along the surface S in the same manner as used in the formation of the bit lines 31. Subsequently, the above-described stacking step, patterning step, and insulating layer formation step are performed again to form memory cells MC2 each located at a position right above each memory cell MC1 via the word line 20. Thereafter, bit lines 32 are formed on the upper sides of the memory cells MC2 in the same manner as used in the formation of the bit lines 31. A memory device 10, having the memory cells MC shown in FIG. 4, can be manufactured by the above-described method.

A second embodiment will be described as one example of a memory device. The description of the second embodiment is primarily made by reference to differences from the first embodiment, and description of features in common between these embodiments may be omitted.

Figure 8:
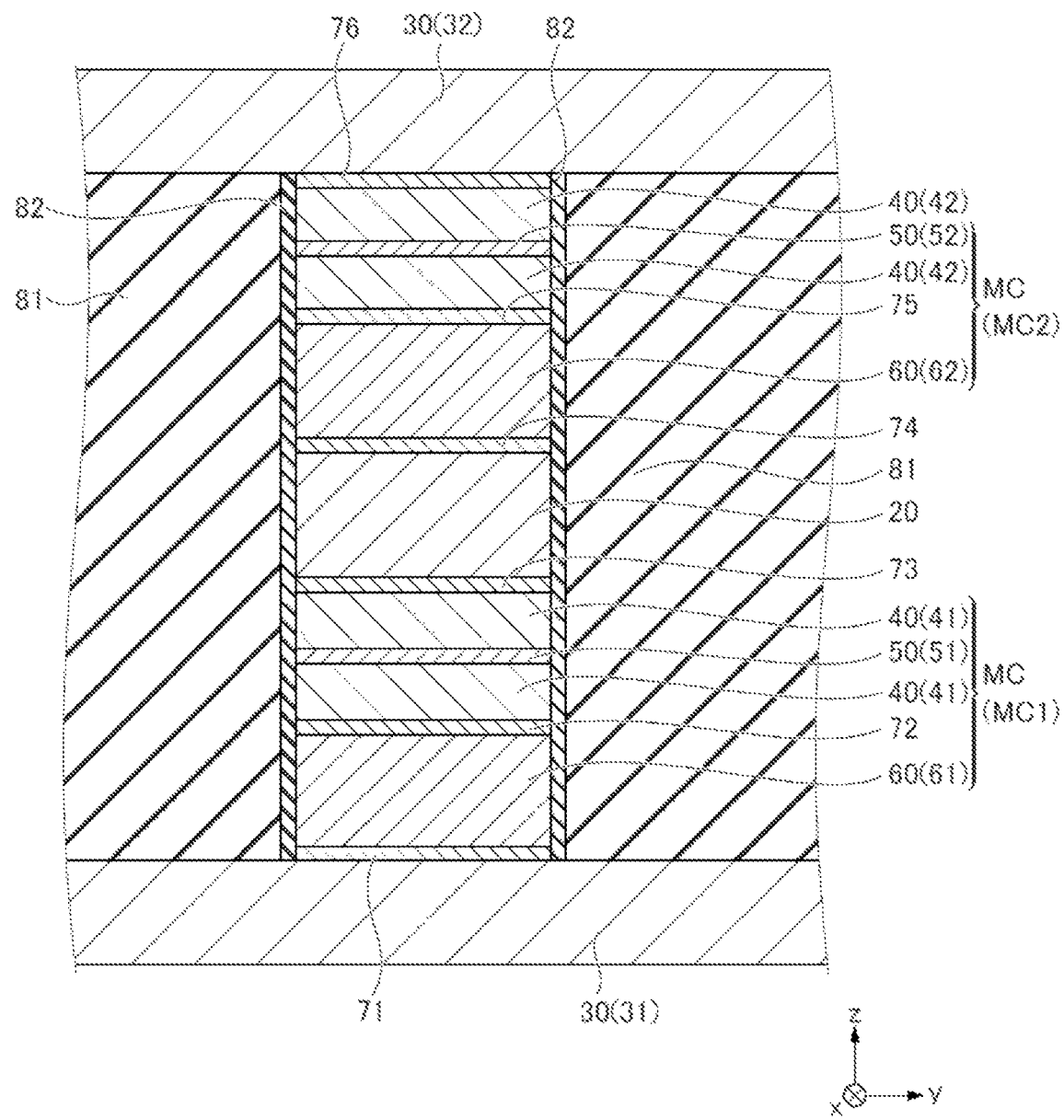
FIG. 8 illustrates a cross-sectional view of certain memory cells and surroundings in a memory device according to a second embodiment.

FIG. 8 depicts, in the same view as FIG. 4, a configuration of certain memory cells MC and vicinity in a memory device 10 according to the second embodiment. As shown in FIG. 8, in the second embodiment the adjacent layer 50 is not formed such that it covers the upper surface of the phase-change layer 40 but is formed such that it is embedded in the phase-change layer 40 (or disposed different portions of a phase-change layer 40). In the second embodiment, the upper surface of the phase-change layer 40 is covered with the conductive layer 73 or the conductive layer 76.

In the present embodiment, the adjacent layer 50 is still in direct contact with the phase-change layer 40. Therefore, the adjacent layer 50 can achieve the same effect as that described above with reference to the first embodiment.

In the formation of a memory cell MC having the configuration shown in FIG. 8, the adjacent layer 50 is formed by CVD in the process of forming the phase-change layer 40, and subsequently the remaining portion of the phase-change layer 40 is formed.

A third embodiment will be described as one example of a memory device. The description of the third embodiment is primarily made by reference to differences from the first embodiment and/or the second embodiment. Description of features in common between these different embodiments may be omitted.

Figure 9:
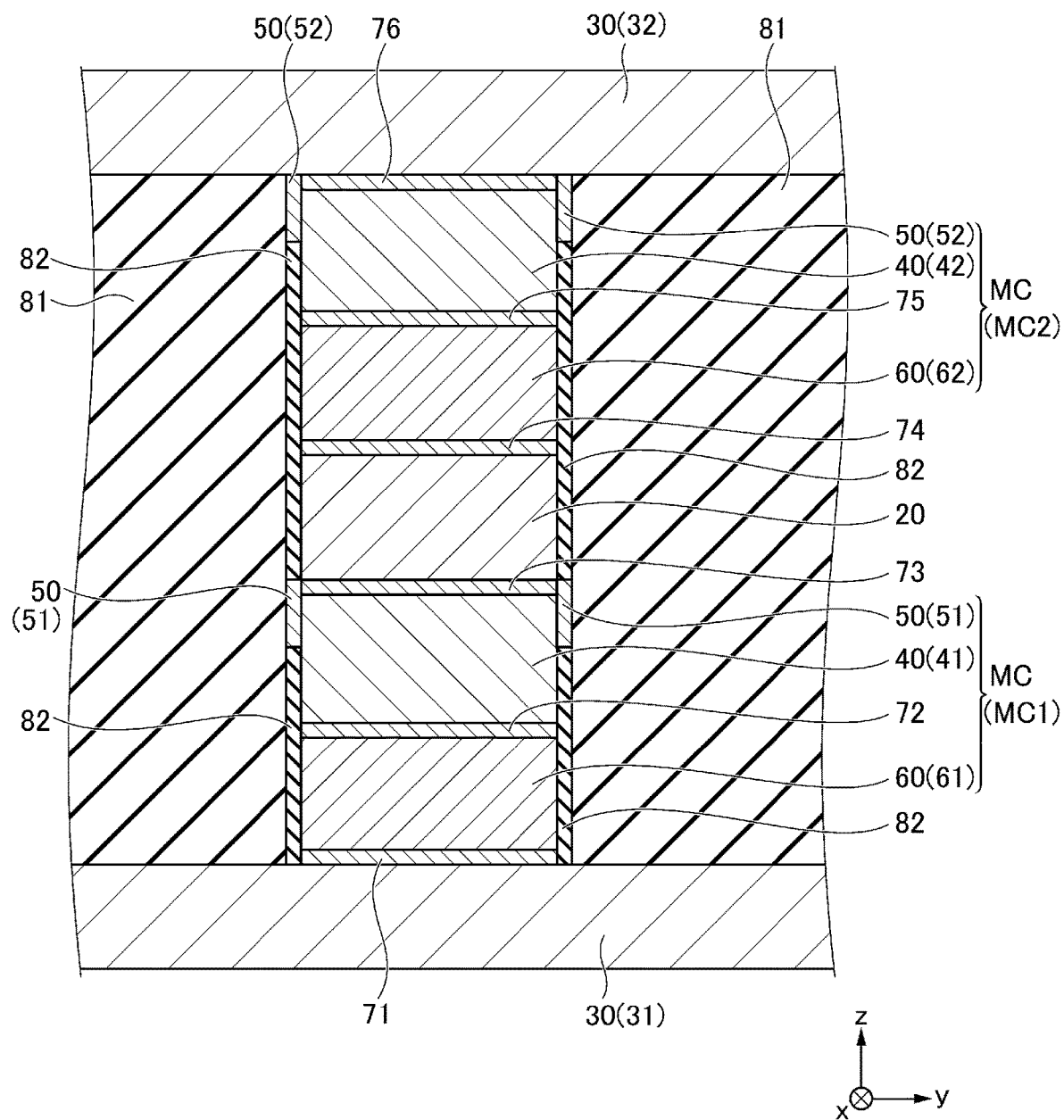
FIG. 9 illustrates a cross-sectional view of certain memory cells and surroundings in a memory device according to a third embodiment.

FIG. 9 depicts, in the same view as FIG. 4, a configuration of certain memory cells MC and vicinity in a memory device 10 according to the third embodiment. As shown in FIG. 9, in the third embodiment the adjacent layer 50 is not formed such that it covers the upper surface of the phase-change layer 40 but is formed such that it covers part of the side surfaces of the phase-change layer 40. In particular, in the third embodiment a part of the insulating layer 82, which covers the entire side surfaces of the phase-change layer 40 in the first embodiment (FIG. 4), is replaced with the adjacent layer 50. In the third embodiment, the upper surface of the phase-change layer 40 is covered with the conductive layer 73 or the conductive layer 76.

Thus, in the present embodiment, the adjacent layer 50 is disposed at a position adjacent to the phase-change layer in directions (e.g., x direction and y direction) perpendicular to the direction (e.g., z direction) in which the word line 20 (first interconnect layer), the phase-change layer 40, and the bit line 30 (second interconnect layer) are stacked. In third embodiment, the adjacent layer 50 is still in direct contact with the phase-change layer 40. Therefore, the adjacent layer 50 can achieve substantially the same effect as that described above with reference to the first embodiment.

Figure 10:
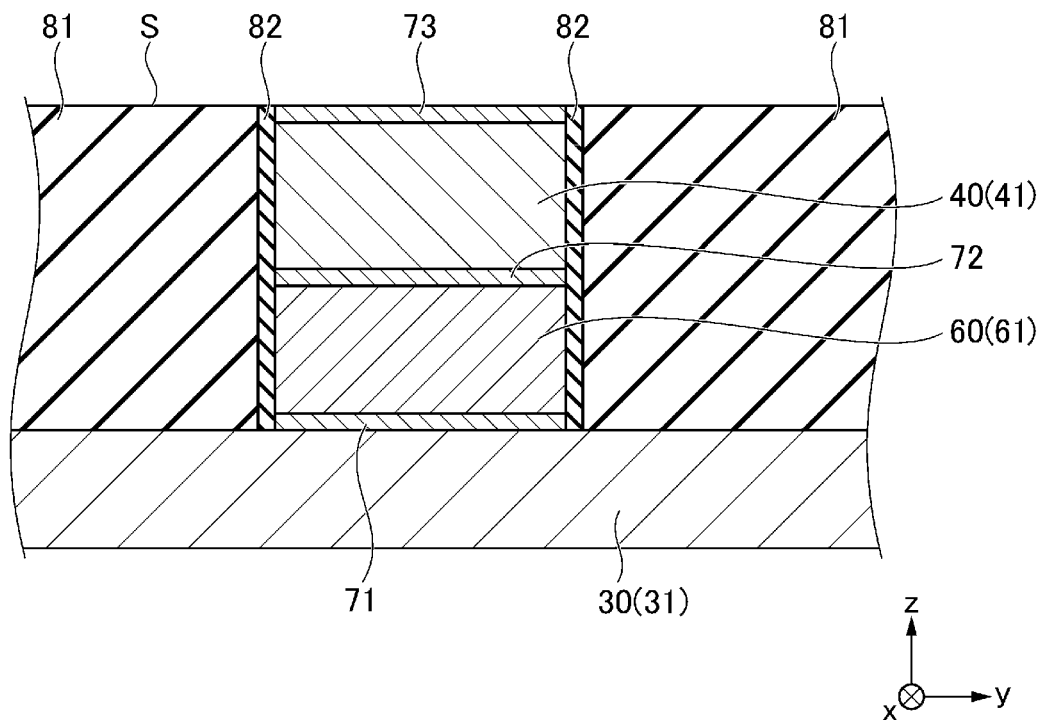
FIGS. 10-12 depict aspects related to a method for manufacturing a memory device according to a third embodiment.

A method for manufacturing the memory device 10 according to the third embodiment will now be described. The same stacking step, patterning step and insulating layer formation step as in the first embodiment are also performed for the third embodiment to form the lower memory cells MC1. In the third embodiment, however, the adjacent layer 51 is not formed in the stacking step. Therefore, the stacked structure after completion of the insulating layer formation step has the configuration shown in FIG. 10 rather than the configuration shown in FIG. 7.

<Recess Formation Step>

Figure 11:
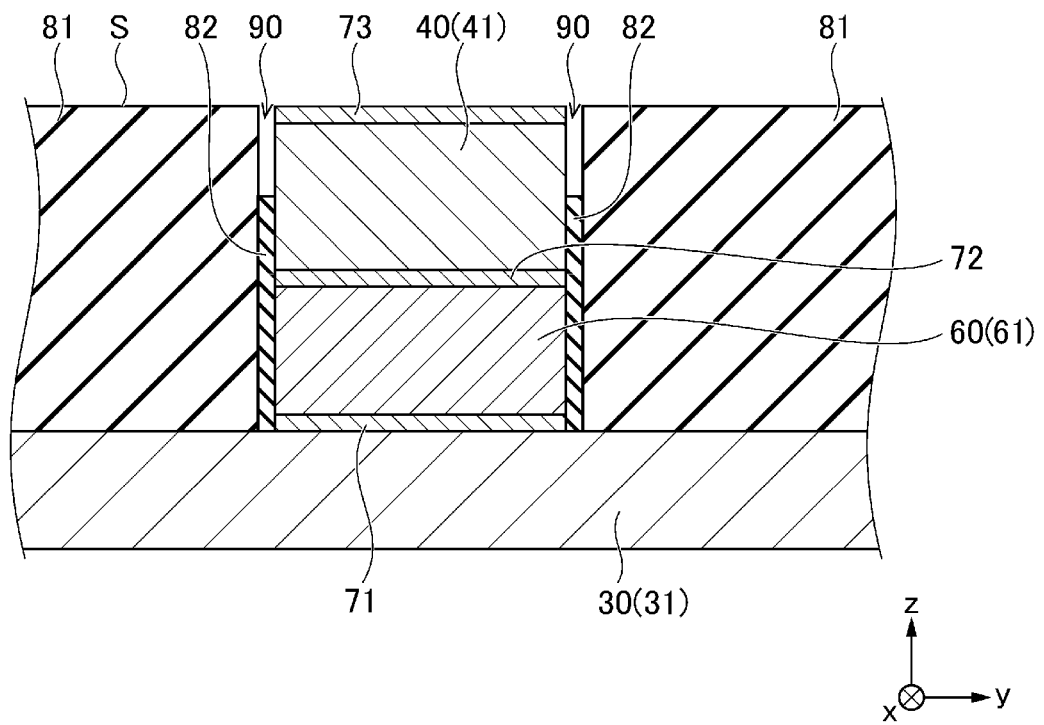

In the third embodiment, a recess formation step is performed after completion of the lower insulating layer formation step. In the recess formation step, an upper portion of the insulating layer 82 is selectively removed, for example, by wet etching. As a result, as shown in FIG. 11, a recess 90 is formed in the surface S. A part (upper part) of the side surfaces of the phase-change layer 41 is exposed in the recess 90.

<Adjacent Layer Formation Step>

Figure 12:
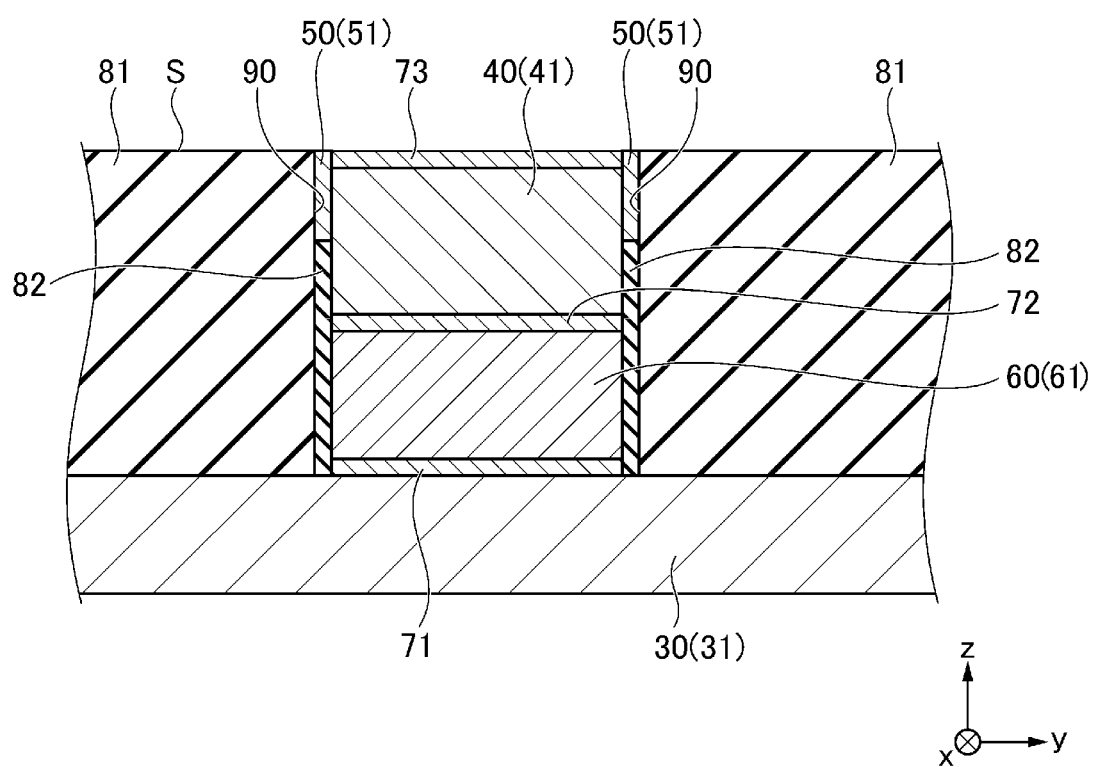

Subsequently, an adjacent layer 51 is formed by, for example, CVD such that it fills the recess 90. Thereafter, the surface S is planarized again by CMP. FIG. 12 shows a cross-sectional view of a portion of the resulting structure upon completion of the adjacent layer formation step.

After forming the memory cells MC1 in the above-described manner, word lines 20 are formed along the surface S as in the first embodiment. Subsequently, the above-described stacking step, patterning step, insulating layer formation step, recess formation step, and adjacent layer formation step are performed again to form memory cells MC2 each located at a position right above each memory cell MC1 via the word line 20. Thereafter, bit lines 32 are formed on the upper sides of the memory cells MC2 in the same manner as used in the formation of the bit lines 31. A memory device 10, having the memory cells MC shown in FIG. 9, can be manufactured by the above-described method.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory device, comprising:
    a first interconnect layer;
    a second interconnect layer;
    a phase-change layer between the first interconnect layer and the second interconnect layer and configured to reversibly transition between a crystalline state and an amorphous state; and
    an adjacent layer contacting and embedded in the phase-change layer and comprising tellurium and at least one of titanium, zirconium, or hafnium.

2. The memory device according to claim 1, wherein an atomic concentration of tellurium in the adjacent layer is in a range of 60% to 70%.

3. The memory device according to claim 1, wherein the phase-change layer comprises at least one of germanium, antimony, or tellurium.

4. The memory device according to claim 1, further comprising:
    a selector layer between the first interconnect layer and the phase-change layer.

5. A memory device, comprising:
    a first interconnect layer;
    a second interconnect layer;
    a phase-change layer between the first interconnect layer and the second interconnect layer in a first direction and configured to reversibly transition between a crystalline state and an amorphous state; and
    an adjacent layer contacting a side surface of the phase-change layer that is facing a second direction perpendicular to the first direction, the adjacent layer comprising a crystalline material comprising tellurium and at least one of titanium, zirconium, or hafnium and having a melting point higher than a melting point of the phase-change layer.

6. The memory device according to claim 5, wherein an atomic concentration of tellurium in the adjacent layer is in a range of 60% to 70%.

7. The memory device according to claim 5, wherein the phase-change layer comprises at least one of germanium, antimony, or tellurium.

8. The memory device according to claim 5, wherein the adjacent layer surrounds the phase-change layer.

9. The memory device according to claim 5, further comprising:
    a selector layer between the first interconnect layer and the phase-change layer, wherein
    the adjacent layer does not contact the selector layer.

10. A memory device, comprising:
    a plurality of first interconnects spaced from each other in a first direction, each of the first interconnects extending in a second direction crossing the first direction;
    a plurality of second interconnects spaced from each other in the second direction, the plurality of second interconnects being above the plurality of first interconnects in a third direction intersecting the first and second directions, each of the second interconnects extending in the first direction;
    a plurality of third interconnects spaced from each other in the second direction, the plurality of third interconnects being below the plurality of first interconnects in the third direction, each of the third interconnects extending in the first direction;
    a first array of memory cells between the plurality of first interconnects and the plurality of second interconnects; and
    a second array of memory cells between the plurality of first interconnects and the plurality of third interconnects, wherein each memory cell comprises:
    a phase-change layer configured to reversibly transition between a crystalline state and an amorphous state; and
    an adjacent layer contacting and embedded in the phase-change layer, the adjacent layer comprising tellurium and at least one of titanium, zirconium, or hafnium.

11. The memory device according to claim 10, wherein an atomic concentration of tellurium in the adjacent layer is in a range of 60% to 70%.

12. The memory device according to claim 10, wherein the phase-change layer is a chalcogenide material composed of germanium, antimony, and tellurium, and the adjacent layer is titanium ditelluride.

* * * * *